(12) United States Patent
Ueki et al.

(10) Patent No.: US 10,170,288 B2
(45) Date of Patent: Jan. 1, 2019

(54) SPUTTERING APPARATUS (71) Applicant: Sakai Display Products Corporation, Sakai-shi, Osaka (JP)

(72) Inventors: Yuhya Ueki, Sakai (JP); Yasuhiro Wakamori, Sakai (JP)

(73) Assignee: Sakai Display Products Corporation, Sakai-shi, Osaka (JP)

(*) Notice: Subject to any disclaimer, the term of this patent is extended or adjusted under 35 U.S.C. 154(b) by 0 days.

(21) Appl. No.: 15/114,360

(22) PCT Filed: Feb. 19, 2014

(86) PCT No.: PCT/JP2014/053923
§ 371 (c)(1),
(2) Date: Jul. 26, 2016

(87) PCT Pub. No.: WO2015/125241
PCT Pub. Date: Aug. 27, 2015

(65) Prior Publication Data
US 2017/0018412 A1 Jan. 19, 2017

(51) Int. Cl.
*C23C 14/50* (2006.01)
*H01J 37/34* (2006.01)
(Continued)

(52) U.S. Cl.
CPC ............ *H01J 37/34* (2013.01); *C23C 14/042* (2013.01); *C23C 14/14* (2013.01); *C23C 14/50* (2013.01);
(Continued)

(58) Field of Classification Search
CPC ................. H01J 37/34; H01J 37/32715; H01J 37/32853; H01J 37/3447; H01J 37/3488; C23C 14/042; C23C 14/14; C23C 14/50
See application file for complete search history.

(56) References Cited

U.S. PATENT DOCUMENTS 5,922,133 A * 7/1999 Tepman .................. C23C 14/50
118/503
6,039,854 A * 3/2000 Liu .......................... C23C 14/50
118/721
(Continued)

FOREIGN PATENT DOCUMENTS

JP H11-241163 A 9/1999
JP 2004-332117 A 11/2004
(Continued)

*Primary Examiner* — John J Brayton
(74) *Attorney, Agent, or Firm* — Rudy J. Ng; Bret E. Field; Bozicevic, Field & Francis LLP (57) ABSTRACT

There is provided a sputtering apparatus in which a holding body holding a substrate by facing a target in a processing chamber is covered by a deposition preventive plate including a substrate retainer for covering a peripheral edge part of the substrate, and a thin film made of metal is deposited on a surface of the substrate exposed to an inside of the deposition preventive plate. A stopper protrusion protrudes at a portion in which the holding body and the deposition preventive plate face each other from one part to the other part, and face the holding body or the deposition preventive plate at a smaller interval than the interval between the deposition preventive plate and the substrate retainer. When the deposition preventive plate and the holding body are thermally deformed to approach each other during film deposition processing, the stopper protrusion contacts with the deposition preventive plate or the holding body, and the deposition preventive plate and the holding body contact with each other, such that, peeling-off a metal film at a contact portion and mixing in a film deposition region of the substrate are prevented.

8 Claims, 6 Drawing Sheets (51) Int. Cl.
*H01J 37/32* (2006.01)
*C23C 14/04* (2006.01)
*C23C 14/14* (2006.01)

(52) U.S. Cl.
CPC .. *H01J 37/32715* (2013.01); *H01J 37/32853* (2013.01); *H01J 37/3447* (2013.01); *H01J 37/3488* (2013.01)

(56) References Cited

U.S. PATENT DOCUMENTS

| | | | | |
|---|---|---|---|---|
| 6,146,504 | A * | 11/2000 | Patadia | C23C 14/50 118/728 |
| 2001/0008208 | A1* | 7/2001 | Futagawa | C23C 14/34 204/298.09 |
| 2003/0098124 | A1* | 5/2003 | Clark | C23C 14/042 156/751 |
| 2009/0314964 | A1* | 12/2009 | Aoki | H01J 37/20 250/492.21 |

FOREIGN PATENT DOCUMENTS

| | | |
|---|---|---|
| JP | 2013104128 A | 5/2013 |
| JP | 2013179353 A | 9/2013 |

* cited by examiner

| | THICKNESS OF LINER | | | CONTACT/NON-CONTACT STATE | |
|---|---|---|---|---|---|
| | STOPPER A | STOPPER B | STOPPER C | POSITION X | POSITION Y |
| CONDITION 1 | 1 mm | — | 1 mm | CONTACT | NON-CONTACT |
| CONDITION 2 | 3 mm | — | 3 mm | NON-CONTACT | CONTACT ※CONTACT IS TOO STRONG |
| CONDITION 3 | 1 mm | 1 mm | 1 mm | PART CONTACT | CONTACT OR NON-CONTACT |
| CONDITION 4 | 2 mm | 2 mm | 2 mm | NON-CONTACT | CONTACT OR NON-CONTACT |

SPUTTERING APPARATUS

CROSS-REFERENCE TO RELATED APPLICATIONS

This application is the national phase under 35 U.S.C. § 371 of PCT International Application No. PCT/JP2014/053923 which has an International filing date of Feb. 19, 2014 and designated the United States of America.

FIELD

The present invention relates to a sputtering apparatus for depositing a thin film made of metal on a surface of a substrate.

BACKGROUND

For example, in manufacturing of a liquid crystal panel for an image display, various semiconductors, or the like, a sputtering apparatus which forms a thin film of metal on one surface of a substrate is used (for example, see Japanese Patent Laid-Open Publication No. 11-241163 and Japanese Patent Laid-Open Publication No. 2004-332117). The sputtering apparatus is configured in such a manner that the substrate and a target are disposed to face each other inside of a processing chamber maintained at high vacuum, rare gas (Ar gas, etc.) is introduced into the processing chamber as well as a high voltage is applied between the substrate and the target, and ionized rare gas elements collide with a target surface, such that atoms of the target surface are sprung out to form a thin film of a metallic material of the target on the surface of the substrate.

The substrate is carried into the processing chamber with being held by a tray-shaped holding body, and is positioned at a processing position facing the target, to be subjected to film deposition processing. In this case, a part of the target atoms sprung out from the target may be attached to the holding body. In manufacturing of the liquid crystal panel, it is necessary to provide a non-film deposition region on a peripheral edge part of a substrate made of glass, and the holding body includes a substrate retainer for covering the non-film deposition region of the substrate, and thus an unnecessarily metal film may be formed on the surface of the substrate retainer. In the sputtering apparatuses disclosed in Japanese Patent Laid-Open Publication No. 11-241163 and Japanese Patent Laid-Open Publication No. 2004-332117, a deposition preventive plate is provided inside of the processing chamber, and the film deposition processing is performed while one surface of the holding body holding the substrate is covered by the deposition preventive plate, so as to prevent an unnecessarily film deposition to the holding body, in particular, to the substrate retainer.

Further, the sputtering apparatus described in Japanese Patent Laid-Open Publication No. 11-241163 is configured as an in-line type sputtering apparatus in which a plurality of processing chambers are juxtaposed in a straight-line state along a conveying direction of the substrate together with a load lock chamber, a heating chamber and an unload chamber, and the substrate sequentially carried into each processing chamber is subjected to the film deposition processing.

In addition, the sputtering apparatus described in Japanese Patent Laid-Open Publication No. 2004-332117 is configured as a sheet type sputtering apparatus in which a plurality of processing chambers are radially juxtaposed together with a load lock chamber, a heating chamber and an unload chamber, and the substrate is carried into each processing chamber by an operation of a robot for conveying disposed at a center of the juxtaposed region, to be subjected to the film deposition processing.

SUMMARY

The deposition preventive plate of the sputtering apparatus as described above faces the surface of the holding body in proximity thereto at an interval of about several mm, in order to prevent the unnecessary film deposition to the holding body. In the sputtering apparatus described in Japanese Patent Laid-Open Publication No. 11-241163, after the substrate is positioned within the processing chamber, the deposition preventive plate moves to be close to the substrate and the holding body, such that a proximity arrangement between the same and the holding body is achieved.

Meanwhile, for example, in manufacturing of the liquid crystal panel, when using a large-size glass substrate, and depositing a thick metal film by a material having high conductivity such as Cu, a processing time is long, and a temperature in the processing chamber reaches a high temperature, such that the deposition preventive plate and the holding body are deformed due to a thermal expansion, and therefore there is a risk that these come in contact with each other at facing parts thereof. When such a contact occurs, the metal films attached to the surfaces of the deposition preventive plate and the holding body are peeled-off and mixed into a film deposition region of the substrate, such that there are problems of occurring a deterioration in a film deposition quality and reducing a product yield.

These problems may be mitigated by increasing the interval between the deposition preventive plate and the holding body, but the target atoms are entered through the interval, and as a result, a new problem of enlarging an unnecessary film deposition range of the holding body occurs.

In consideration of the above-mentioned circumstances, it is an object of the present invention to provide a sputtering apparatus which is capable of performing film deposition processing while a deposition preventive plate is close to a holding body holding a substrate without occurring a contact between the holding body and the deposition preventive plate, and improving a film deposition quality as well as achieving a prevention of unnecessary film deposition.

One embodiment of the present invention provides a sputtering apparatus which includes a processing chamber in which a target is disposed, a holding body which retains a peripheral edge part of a substrate by a substrate retainer to hold the substrate, and a deposition preventive plate which covers the holding body including the substrate retainer within the processing chamber, and is configured to deposit a metal film on a surface of the substrate which is exposed to an inside of the deposition preventive plate to face the target, by sputtering the target within the processing chamber, the sputtering apparatus including: a stopper protrusion which protrudes, at a portion in which the deposition preventive plate and the holding body face each other, from one part selected from the group consisting of the deposition preventive plate and the holding body to the other part, and the stopper protrusion and the other part face each other at a smaller interval than the interval between the deposition preventive plate and the substrate retainer.

When the deposition preventive plate and the holding body are thermally deformed to approach each other, the stopper protrusion which protrudes at the portion in which the deposition preventive plate and the holding body face each other contacts with the deposition preventive plate or the holding body to prevent a contact with the deposition preventive plate and the holding body. Accordingly, there is no risk that the metal film attached to the surface of the deposition preventive plate and the holding body is peeled-off and mixed in a film deposition region of the substrate to result in a deterioration in the film deposition quality, and it is possible to perform film deposition processing while the deposition preventive plate is close to the holding body.

In addition, in the sputtering apparatus according to one preferred embodiment of the present invention, it is preferred that the substrate has a rectangular shape, and the stopper protrusion is provided at a central part of one side of the substrate, and in the vicinity of corners on both ends of the one side.

When the rectangular substrate applied to manufacturing of the liquid crystal panel, etc. is the target to be deposited, it is possible to accomplish the object by providing the stopper protrusion at the central part of one side of the substrate, and in the vicinity of the corners on the both ends of the one side.

Further, in the sputtering apparatus according to one preferred embodiment of the present invention, it is preferred that the stopper protrusion is made of a material having a lower hardness than that of the deposition preventive plate or the holding body.

Since the stopper protrusion is made of the material having a low hardness such as a resin material, for example, it is possible to reduce a risk of occurring abrasion powders of the respective materials at a contact portion between the stopper protrusion and the deposition preventive plate or the holding body, and prevent a deterioration in the film deposition quality due to mixing of the abrasion powders.

Further, in the sputtering apparatus according to one preferred embodiment of the present invention, it is preferred that a tip of the stopper protrusion is formed in a tapered shape.

The stopper protrusion contacts with the deposition preventive plate or the holding body by the tapered tip part thereof, such that it is possible to decrease a generation amount of peeled-off metal and the abrasion powders at the contact portion, and maintain good film deposition quality.

Furthermore, in the sputtering apparatus according to one preferred embodiment of the present invention, it is preferred that a plurality of the processing chambers each of which is the above-mentioned processing chamber are juxtaposed in a straight-line state, the substrate and the holding body are conveyed along a direction in which the processing chambers are juxtaposed, and are sequentially carried into and out of the plurality of the processing chambers, so as to be configured as an in-line type, or a plurality of the processing chambers each of which is the above-mentioned processing chamber are radially juxtaposed, and the substrate is sequentially carried into and out of each processing chamber by an operation of a carrying-in and -out unit provided at a center of the juxtaposed region, so as to be configured as a sheet type.

According to one embodiment of the present invention, since the contact between the deposition preventive plate and the holding body due to a thermal deformation is prevented by the function of the stopper protrusion provided at the portion in which the deposition preventive plate and the holding body face each other, it is possible to perform film deposition processing while the deposition preventive plate is close to the holding body, as well as maintain good film deposition quality of the substrate.

The above and further objects and features will more fully be apparent from the following detailed description with accompanying drawings.

DETAILED DESCRIPTION

Figure 1:
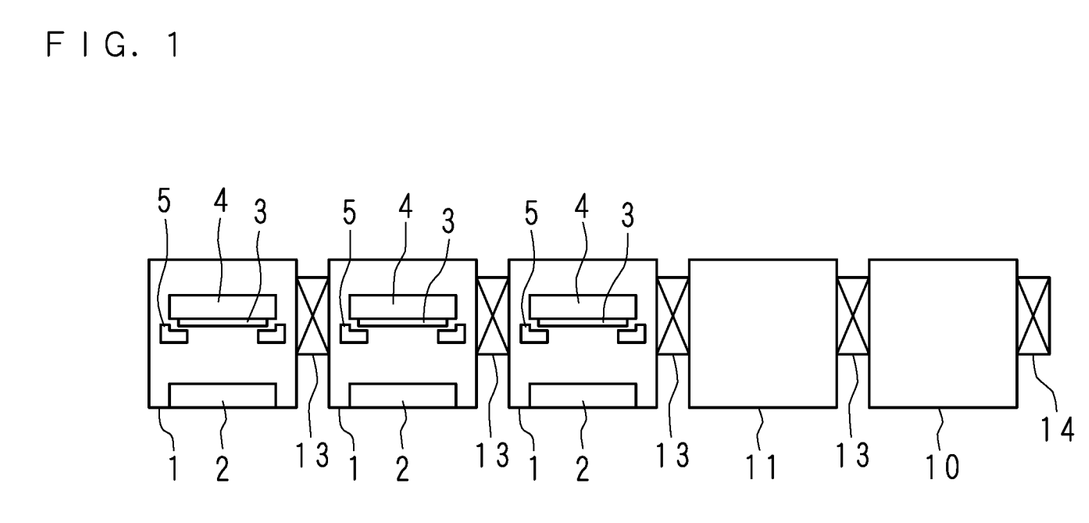
FIG. 1 is a schematic view of an in-line type sputtering apparatus.
Figure 2:
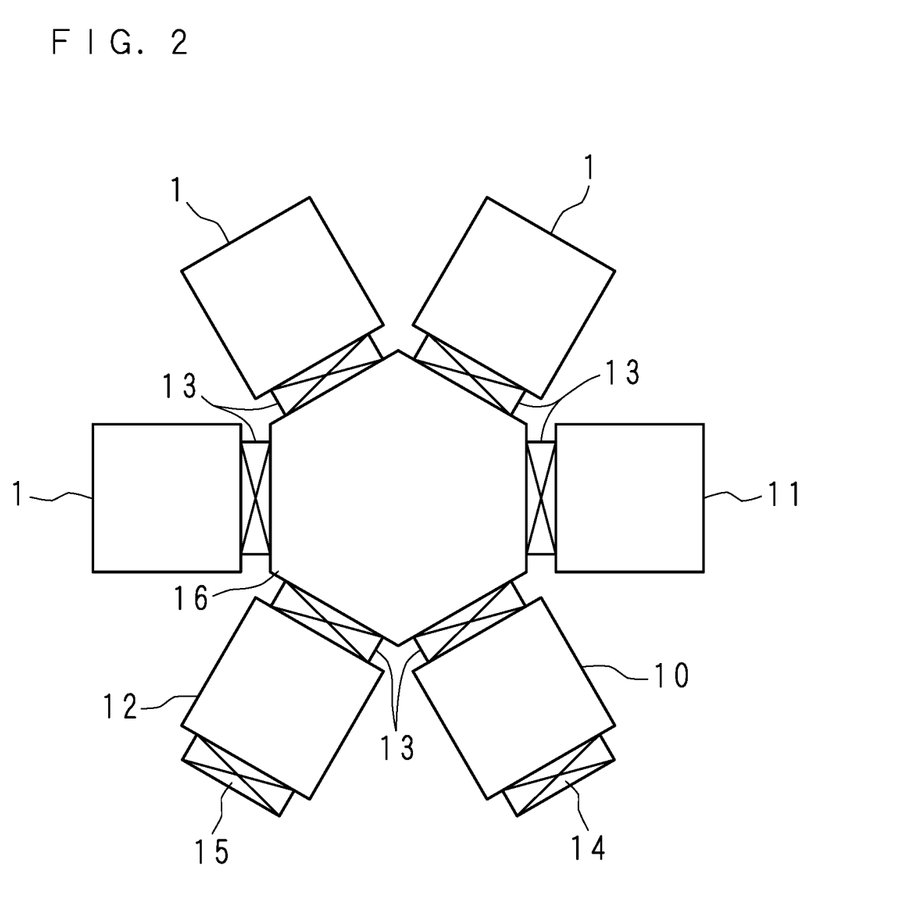
FIG. 2 is a schematic view of a sheet type sputtering apparatus.

Hereinafter, the present invention will be described in detail with reference to the accompanying drawings illustrating the embodiment thereof. FIG. 1 is a schematic view of an in-line type sputtering apparatus, and FIG. 2 is a schematic view of a sheet type sputtering apparatus. The present invention which will be illustrated below may be applied to both of the in-line type and sheet type sputtering apparatuses.

Each of the sputtering apparatuses illustrated in FIGS. 1 and 2 includes three processing chambers 1, 1 and 1, a load lock chamber 10, and a heating chamber 11. In FIG. 1, the processing chambers 1, 1 and 1 are arranged on a straight line, which communicate with each other by an opening of gate valves 13 and 13 provided between the respective chambers.

The load lock chamber 10 and the heating chamber 11 are arranged at one side of the juxtaposed region of the processing chambers 1, 1 and 1 on the straight line. The gate valve 13 is provided between the load lock chamber 10 and the heating chamber 11, and also the gate valve 13 is provided between the heating chamber 11 and the processing chamber 1 adjacent thereto, and the respective chambers may communicate with each other by the opening of the individual gate valve 13. In addition, the load lock chamber 10 is provided with a carrying-in and -out valve 14 on a side opposite to the gate valve 13, and the load lock chamber 10 may communicate with an outside by the opening of the carrying-in and -out valve 14.

Each processing chamber 1 has a target 2 respectively disposed inside thereof, and is configured so as to perform film deposition processing on one surface of a substrate 3 facing the target 2. The substrate 3 is held by an individual holding body 4 formed in a tray shape, and is conveyed along a conveying path provided in a direction in which the processing chambers 1, 1 and 1 are juxtaposed together with the holding body 4, so as to be positioned with respect to the target 2 within each processing chamber 1. A metallic material of the target 2 is deposited on the surface of the substrate 3 positioned as described above within each processing chamber 1 with in a high vacuum condition by closing the gate valves 13 and 13 on both sides of the processing chambers 1 to form a thin film thereof.

As schematically illustrated in FIG. 1, each processing chamber 1 is provided with a deposition preventive plate 5 therein. The deposition preventive plate 5 covers a peripheral edge part of the substrate 3 and the holding body 4 positioned within the processing chamber 1 as described below, and functions to prevent film deposition to the covered portions. The conveying path of the substrate 3 passes through inside the processing chambers 1, 1 and 1 via the load lock chamber 10 and the heating chamber 11, and serves as a circulation path in which the substrate returns to the load lock chamber 10. The substrate 3 is sequentially carried into the processing chambers 1, 1 and 1 through the load lock chamber 10 and the heating chamber 11, and after ending the film deposition processing within each processing chamber 1, is carried out to the outside through the load lock chamber 10.

In FIG. 2, the processing chambers 1, 1 and 1 are radially arranged together with the load lock chamber 10, the heating chamber 11 and an unload chamber 12, and the respective chambers may communicate with a carrying-in and -out chamber 16 provided at a center of the juxtaposed region by the opening of the individual gate valve 13. The carrying-in and -out chamber 16 includes a carrying-in and -out robot (not illustrated) installed therein, which can be operated under vacuum. In addition, the load lock chamber 10 is provided with a carrying-in valve 14 on a side opposite to the gate valve 13, the unload chamber 12 is provided with a carrying-out valve 15 on a side opposite to the gate valve 13, and the load lock chamber 10 and the unload chamber 12 may communicate with the outside by the opening of the carrying-in valve 14 and the carrying-out valve 15.

The substrate is carried into the load lock chamber 10 through the opened carrying-in valve 14, and is sequentially carried into the heating chamber 11, each processing chamber 1 and the unload chamber 12 by an operation of the carrying-in and -out robot through the opened individual gate valve 13, to be subjected to the film deposition processing within each processing chamber 1. As similar to the sputtering apparatus illustrated in FIG. 1, a target and a deposition preventive plate are installed in each processing chamber 1. The substrate is carried into the processing chamber 1 to be positioned with respect to the target, and is subjected to the film deposition processing while the peripheral edge thereof is covered by the deposition preventive plate. Furthermore, the substrate, the target and the deposition preventive plate will not be illustrated in FIG. 2.

Figure 3:
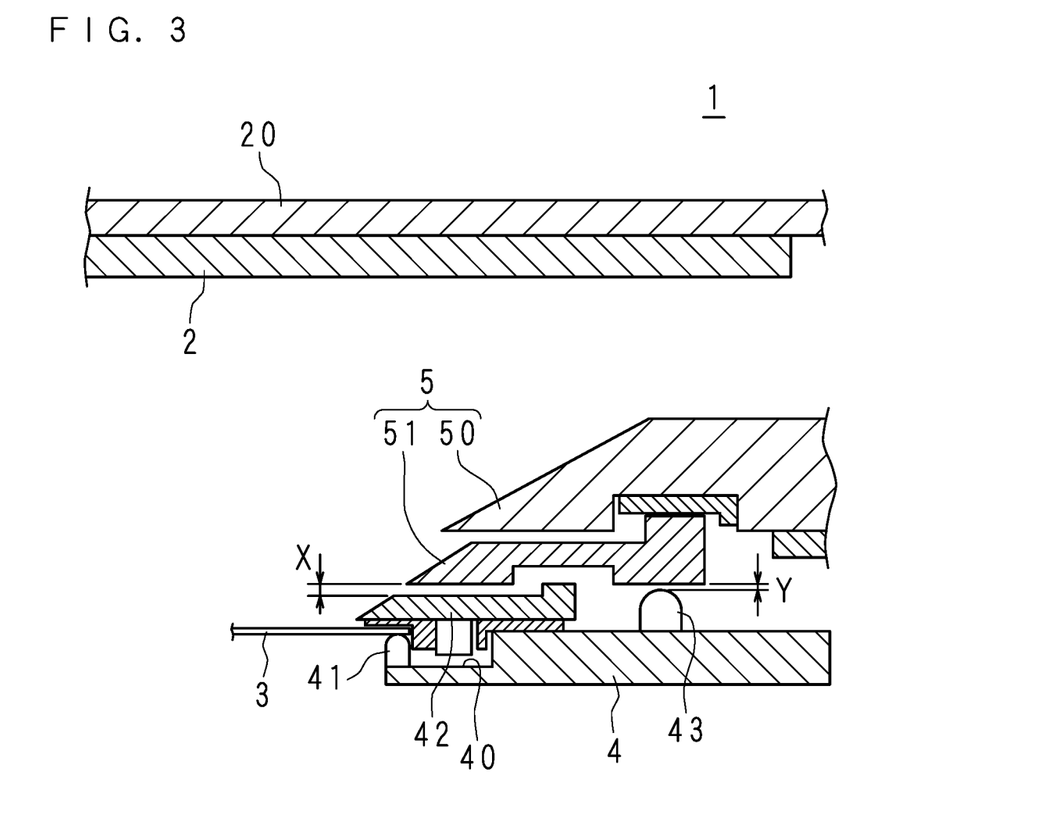
FIG. 3 is a cross-sectional view schematically illustrating an internal configuration of a processing chamber.

FIG. 3 is a cross-sectional view schematically illustrating an internal configuration of the processing chamber, and illustrates major parts of the in-line type sputtering apparatus in a state at the time of film deposition processing of the substrate 3 within the processing chamber 1 in an enlarged form. The target 2 supported by a support plate 20 is disposed inside of the processing chamber 1, and the substrate 3 is introduced into the processing chamber 1 together with the holding body 4 to be positioned so as to face the target 2.

The holding body 4 is a frame-shaped tray having the illustrated cross section, and has a recess 40 formed in an entire periphery of an inner peripheral edge thereof with a slightly larger dimension than the substrate 3. The substrate 3 is contained in the recess 40 with a rear surface thereof being supported by a receiving pin 41 which protrudes from a bottom of the recess 40, and is held by the holding body 4 while the peripheral edge part of a front surface thereof is pressed by a substrate retainer 42 fixed so as to protrude to an inside of the recess 40. In the in-line type sputtering apparatus illustrated in FIG. 1, the holding body 4 holding the substrate 3 as described above conveys the substrate 3 by moving in a horizontal direction of the drawings to position the substrate 3 at the illustrated position. In this state, sputtering is executed thereon, and a thin film made of metallic material (Cu etc.) of the target 2 is deposited on the surface of the substrate 3 which is exposed to the inside of the substrate retainer 42.

The deposition preventive plate 5 includes a fixing plate 50 fixedly supported in the processing chamber 1, and a floating plate 51 floatingly supported by the fixing plate 50. The fixing plate 50, which is provided between the holding body 4 and substrate 3 and the target 2 positioned in the processing chamber 1 so as to be substantially parallel therewith, is a frame body having the illustrated cross section, and is located with being spaced at an appropriate length from the surface of the holding body 4 positioned as described above. The floating plate 51 is a frame body provided so as to protrude at an appropriate length inward from an inner edge of the fixing plate 50, and faces the substrate retainer 42 provided at the inner edge of the holding body 4 positioned as described above at a minimal interval X.

In a film deposition process executed as described above, the deposition preventive plate 5 provided as described above functions to attach target atoms in the processing chamber 1, and prevent attaching thereof to the holding body 4, in particular, to the surface of the substrate retainer 42. The floating plate 51 of the deposition preventive plate 5 and the substrate retainer 42 of the holding body 4 face each other at the interval X. The interval X is set to be about 4 to 6 mm, such that it is possible to successfully prevent an entrance of the target atoms, and effectively prevent film deposition on the surface of the holding body 4 including the substrate retainer 42.

The holding body 4 further includes a stopper protrusion 43. The stopper protrusion 43 protrudes toward the floating plate 51 on the outside from the substrate retainer 42 at a position facing the floating plate 51 of the deposition preventive plate 5, briefly, at a position as close to the substrate retainer 42 as possible, and a tip of the stopper protrusion 43 faces the floating plate 51 at an interval Y which is smaller than the interval X. Further, it is preferable that the stopper protrusion 43 is made of a material having a lower hardness, for example, a resin material, than the substrate retainer 42 and floating plate 51 which are made of a metal material such as stainless steel, titanium, etc. In addition, it is preferable that the tip of the stopper protrusion 43 is formed in a tapered shape such as the illustrated half sphere shape.

Figure 4A:
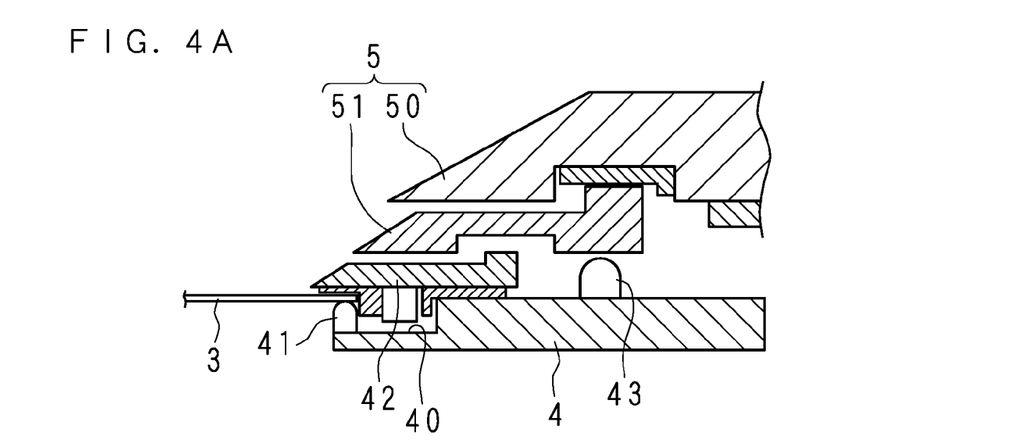
FIG. 4A is a view describing an operation of a stopper protrusion.
Figure 4B:
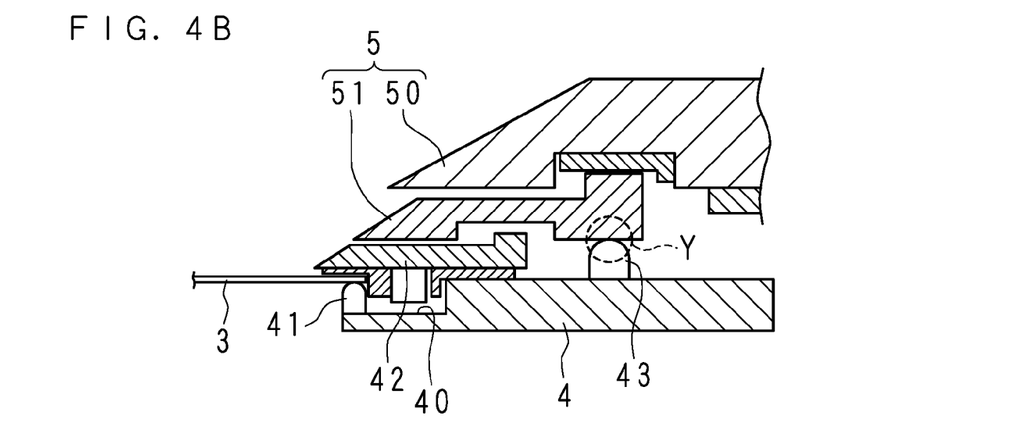
FIG. 4B is a view describing an operation of a stopper protrusion.
Figure 4C:
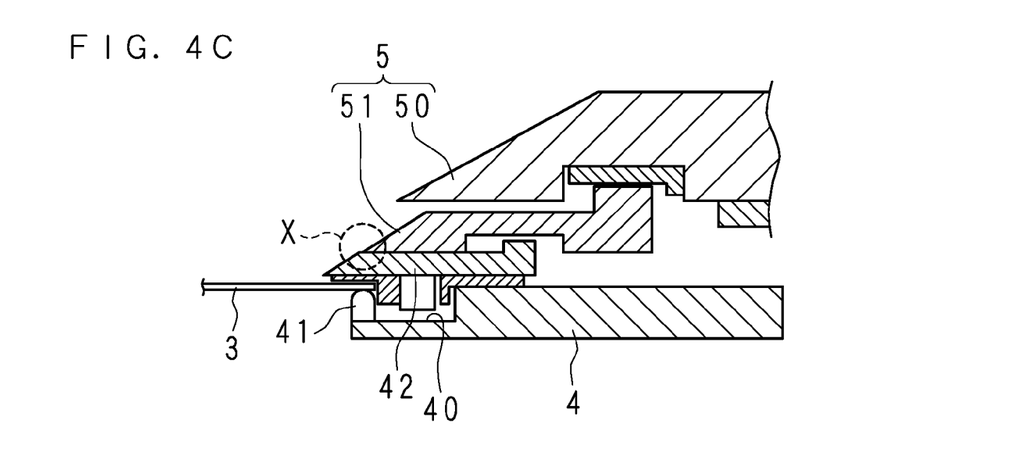
FIG. 4C is a view describing an operation of a stopper protrusion.

FIGS. 4A-4C are views describing an operation of the stopper protrusion 43. FIG. 4A illustrates a state at the time of starting the film deposition processing. The above-described film deposition processing is executed on the substrate 3 carried into the processing chamber 1 together with the holding body 4 while being positioned with respect to the target 2 and the deposition preventive plate 5 as illustrated in FIGS. 4A and 3. For example, in manufacturing of the liquid crystal panel, a large-size glass substrate is used as the substrate 3, and a metal film having high conductivity such as Cu, etc. is deposited on the substrate 3. However, in this case, a processing time is long, and a temperature in the processing chamber 1 reaches a high temperature, such that the holding body 4 and the deposition preventive plate 5 are deformed due to a thermal expansion, and therefore there is a risk that these approach to and come into contact with each other.

Whereas, the sputtering apparatus of the present embodiment has the stopper protrusion 43, and the tip of the stopper protrusion 43 faces the floating plate 51 which is a part of the deposition preventive plate 5 at the interval Y. Since the interval Y is smaller than the interval X between the floating plate 51 and the substrate retainer 42, as illustrated in FIG. 4B, the above-described contact due to the thermal expansion occurs between the stopper protrusion 43 and the floating plate 51 (at a position Y illustrated by a broken line mark ○ in FIG. 4B), and the interval X between the floating plate 51 and the substrate retainer 42 is maintained.

FIG. 4C illustrates a state of contact that occurs in a sputtering apparatus which does not have the stopper protrusion 43. In this case, the above-described contact due to a thermal deformation occurs between the substrate retainer 42 and the floating plate 51 which face each other at the interval X (at a position X illustrated by a broken line mark ○ in FIG. 4C).

When the above-described contact occurs, the metal film attached to the contact portion is peeled-off and scattered around. The contact position in FIG. 4C is close to the surface of the substrate 3 exposed to the inside of the substrate retainer 42, briefly, a film deposition region, and thereby the peeled-off metal film may be mixed in the film deposition region to deteriorate a film deposition quality of the substrate 3.

On the other hand, in FIG. 4B, since the stopper protrusion 43 provided at a position separated from the film deposition region contacts with the floating plate 51, and the contact between the substrate retainer 42 and the floating plate 51 does not occur, it is possible to suppress a risk that the peeled-off metal at the contact portion is mixed in the film deposition region such that it becomes negligible. In this regard, only the target atoms passing through the interval X between the floating plate 51 and the substrate retainer 42 are attached to the contact position between the stopper protrusion 43 and the floating plate 51, and further, the contact between the stopper protrusion 43 and the floating plate 51 occurs only at the tip portion of the stopper protrusion 43, such that a generation amount of the peeled-off metal itself caused by the contact may be decreased, and mixing thereof with the film deposition region may be reduced.

In addition, as described above, when the stopper protrusion 43 is made of a material having a low hardness such as a resin material, it is possible to reduce a risk of occurring abrasion powders of the respective materials by friction at the contact portion between the stopper protrusion 43 and the floating plate 51, and prevent a deterioration in the film deposition quality due to mixing of the abrasion powders. Further, as described above, by forming the tip of the stopper protrusion 43 in a tapered shape, a contact area with the floating plate 51 is decreased, such that it is possible to decrease the generation amount of the peeled-off metal and the abrasion powders at the contact portion, and maintain good film deposition quality of the substrate 3.

It is preferable that the number of the stopper protrusions 43 is decreased as much as possible when seen in terms of prevention of a deterioration in the film deposition quality, but when decreasing the number of the stopper protrusions 43, there is a risk that the substrate retainer 42 and the floating plate 51 come in contact with each other at a portion which is not provided with the stopper protrusion 43, as illustrated in FIG. 4C. In addition, it is necessary for the interval Y between the stopper protrusion 43 and the floating plate 51 to be set so that the contact therebetween occurs with a proper intensity at a temperature during film deposition processing.

Figure 5:
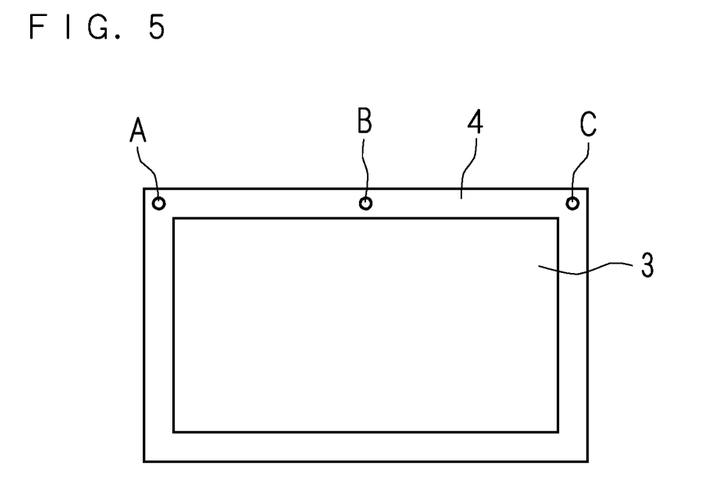
FIG. 5 is a view describing a test performed to verify the proper number and positions of the stopper protrusions.
Figure 6:
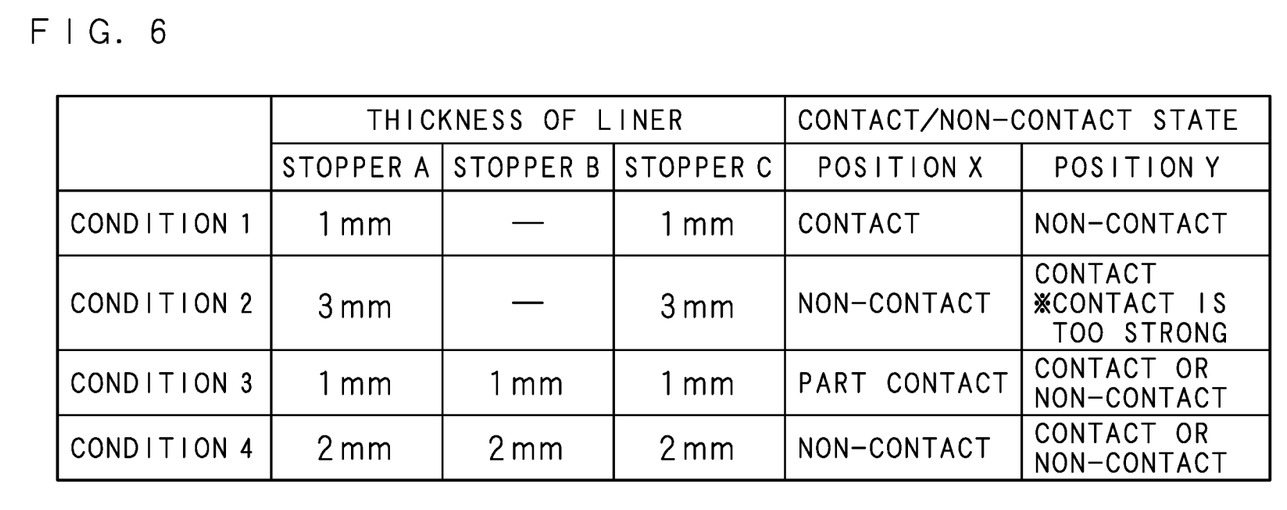
FIG. 6 is a table illustrating results of the test performed to verify the proper number and the positions of the stopper protrusions.

FIG. 5 is a view describing a test performed to verify the proper number and positions of the stopper protrusions 43, and FIG. 6 is a table illustrating results of the test performed to verify the proper number and the positions of the stopper protrusions 43. FIG. 5 illustrates a plan view of the substrate 3 and the holding body 4, and as illustrated in this drawing, the verification test is performed in an order of providing the stopper protrusions 43 having different heights from each other at positions illustrated as A, B and C of holding body 4 holding the rectangular substrate 3, and examining whether the contact between the stopper protrusion 43 and the floating plate 51, and between the substrate retainer 42 and the floating plate 51 is present for each position.

In conditions 1 and 2 illustrated in FIG. 6, the stopper protrusions 43 are provided at the positions A and C in the vicinity of corners on both ends of the one side of the substrate 3 having a rectangular shape, and in conditions 3 and 4, the stopper protrusions 43 are provided at a central position B of the one side, in addition to the positions A and C. The height of the stopper protrusion 43 is changed by setting the intervals X and Y so as to be the same as each other, and installing a liner between the stopper protrusion 43 and the holding body 4. Numerical values in FIG. 6 represent thicknesses of the installed liner.

In condition 1 in which the stopper protrusions 43 having liners with a thickness of 1 mm installed therebetween are provided at the positions A and C, the contact was not observed at the position Y, and the contact was observed at the position X, and thereby it can be seen that the above-described functions due to the stopper protrusions 43 cannot be expected. The contact at the position X was not observed in condition 2 in which liners having a thickness of 3 mm are installed at the positions A and C, but in this case, the contact at the position Y is too strong, and therefore, there is a concern of the occurrence of the abrasion powders of the stopper protrusions 43 and the floating plate 51. As such, when the stopper protrusions 43 are provided only at the positions A and C in the vicinity of the corners of the substrate 3, even if changing the height of the stopper protrusions 43, it is difficult to achieve the above-described functions and effects.

In condition 3 in which the stopper protrusions 43 having liners with a thickness of 1 mm installed therebetween are provided at the position B, in addition to the positions A and C, the contact at a part of the position X was observed, whereas in condition 4 in which the stopper protrusions 43 having liners with a thickness of 2 mm installed therebetween are provided at the same position as condition 3, the contact at the position X was not observed, and at the position Y, a portion with the contact and a portion without the contact are present, and as a result, it could be seen that an adequate contact state was achieved. Accordingly, in the sputtering apparatus having the rectangular substrate 3 to be processed, by providing the stopper protrusions having an appropriate height at the central part of one side and the both corners of the one side, it is possible to achieve the above-described functions and effects.

Further, in the above-described embodiment, the configuration in which the stopper protrusion 43 is provided on the holding body 4 has been described, but a stopper protrusion protruding toward the holding body 4 may be provided on the deposition preventive plate 5 (floating plate 51).

It is to be noted that, as used herein and in the appended claims, the singular forms "a", "an", and "the" include plural referents unless the context clearly dictates otherwise.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A sputtering apparatus, comprising:
   a processing chamber;
   a target disposed in the processing chamber;
   a holding body for receiving a rear surface of a substrate to be disposed in the processing chamber so that a front surface of the substrate faces the target;
   a substrate retainer for covering and pressing a peripheral portion of the front surface of the substrate, the substrate retainer defining an outer edge of a film deposition region of the front surface in which a metal film is to be formed by sputtering the target in the processing chamber;
   a deposition preventive plate which covers the holding body including the substrate retainer without covering the film deposition region so as to prevent unnecessary formation of the metal film on the substrate retainer and the holding body; and
   a stopper protrusion provided in a region where the deposition preventive plate directly faces the holding body, the stopper protrusion protruding from one of the deposition preventive plate and the holding body toward the other of the deposition preventive plate and the holding body so as to prevent the deposition preventive plate from contacting the substrate retainer.

2. The sputtering apparatus according to claim 1, wherein the substrate has a rectangular shape, and the stopper protrusion is provided at a central part of one side of the substrate, and in the vicinity of corners on both ends of the one side.

3. The sputtering apparatus according to claim 1, wherein the stopper protrusion is made of a material having a hardness lower than that of the deposition preventive plate or the holding body.

4. The sputtering apparatus according to claim 1, wherein a tip of the stopper protrusion is formed in a tapered shape.

5. The sputtering apparatus according to claim 1, wherein a plurality of the processing chambers each of which corresponds to the processing chamber defined in claim 1 are juxtaposed in a straight-line state, the substrate and the holding body are conveyed along a direction in which the processing chambers are juxtaposed, and are sequentially carried into and out of the plurality of the processing chambers, so as to be configured as an in-line type.

6. The sputtering apparatus according to claim 1, wherein, a plurality of the processing chambers each of which corresponds to the processing chamber defined in claim 1 are radially juxtaposed, and the substrate is sequentially carried into and out of each of the plurality of the processing chambers by an operation of a carrying-in and -out unit provided at a center of the juxtaposed region, so as to be configured as a sheet type.

7. The sputtering apparatus according to claim 1, wherein a recess for containing the substrate is formed in the holding body.

8. The sputtering apparatus according to claim 7, wherein a convex portion for supporting the back surface of the substrate is provided in the recess.

* * * * *